US010608050B2

(12) United States Patent
Nakayama et al.

(10) Patent No.: US 10,608,050 B2
(45) Date of Patent: Mar. 31, 2020

(54) SOLID-STATE IMAGING DEVICE TO IMPROVE PHOTOELECTRIC EFFICIENCY

(71) Applicant: SONY SEMICONDUCTOR SOLUTIONS CORPORATION, Kanagawa (JP)

(72) Inventors: Norikazu Nakayama, Kanagawa (JP); Hideki Ono, Tokyo (JP); Yoshiaki Obana, Kanagawa (JP); Nobuyuki Matsuzawa, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/756,102

(22) PCT Filed: Aug. 3, 2016

(86) PCT No.: PCT/JP2016/072785
§ 371 (c)(1),
(2) Date: Feb. 28, 2018

(87) PCT Pub. No.: WO2017/047266
PCT Pub. Date: Mar. 23, 2017

(65) Prior Publication Data
US 2018/0350881 A1    Dec. 6, 2018

(30) Foreign Application Priority Data

Sep. 16, 2015    (JP) .................................. 2015-182566

(51) Int. Cl.
*H01L 27/30* (2006.01)
*H01L 27/14* (2006.01)
(Continued)

(52) U.S. Cl.
CPC ............ *H01L 27/307* (2013.01); *H01L 27/14* (2013.01); *H01L 27/146* (2013.01);
(Continued)

(58) Field of Classification Search
None
See application file for complete search history.

(56) References Cited

U.S. PATENT DOCUMENTS

2005/0224819 A1*  10/2005  Araki .................... H01G 9/2031
                                                                  257/79
2013/0049152 A1*   2/2013  Kim ....................... H01L 31/072
                                                                  257/432
(Continued)

FOREIGN PATENT DOCUMENTS

CN        103811518 A     5/2014
CN        104103760 A    10/2014
(Continued)

OTHER PUBLICATIONS

International Search Report and Written Opinion of PCT Application No. PCT/JP2016/072785, dated Nov. 1, 2016, 17 pages.

*Primary Examiner* — Daniel Whalen
(74) *Attorney, Agent, or Firm* — Chip Law Group (57) ABSTRACT

A solid-state imaging device includes a first electrode, a second electrode, and a photoelectric conversion film that is formed between the first electrode and the second electrode and includes an organic semiconductor and an inorganic material.

9 Claims, 7 Drawing Sheets

(51) Int. Cl.
- *H01L 27/146* (2006.01)
- *H01L 51/42* (2006.01)
- *H01L 31/102* (2006.01)
- *H01L 27/28* (2006.01)
- *H01L 31/0296* (2006.01)
- *H01L 31/032* (2006.01)
- *H01L 51/00* (2006.01)
- *H01L 31/0256* (2006.01)

(52) U.S. Cl.
CPC .......... *H01L 27/286* (2013.01); *H01L 31/102* (2013.01); *H01L 51/422* (2013.01); *H01L 27/14647* (2013.01); *H01L 27/14667* (2013.01); *H01L 31/0296* (2013.01); *H01L 31/032* (2013.01); *H01L 51/0072* (2013.01); *H01L 51/0078* (2013.01); *H01L 2031/0344* (2013.01)

(56) References Cited

U.S. PATENT DOCUMENTS

2014/0306180 A1 10/2014 Moriwaki et al.
2015/0311445 A1 10/2015 Udaka et al.
2015/0340401 A1* 11/2015 Yoshii ............... H01L 27/14612
    257/43
2016/0233351 A1* 8/2016 Kim ................ H01L 31/022408
2018/0166504 A1* 6/2018 Kamino ................ H01L 51/447

FOREIGN PATENT DOCUMENTS

| CN | 204720453 U | 10/2015 |
|---|---|---|
| EP | 2919277 A1 | 9/2015 |
| JP | 2002-100793 A | 4/2002 |
| JP | 2004-165515 A | 6/2004 |
| JP | 2007-157999 A | 6/2007 |
| JP | 2009-212468 A | 9/2009 |
| JP | 2012-138582 A | 7/2012 |
| JP | 2013-219190 A | 10/2013 |
| JP | 2014-063999 A | 4/2014 |
| JP | 2014-072328 A | 4/2014 |
| JP | 2014-220488 A | 11/2014 |
| KR | 10-2015-0082246 A | 7/2015 |
| TW | 201421718 A | 6/2014 |
| WO | 2014/073446 A1 | 5/2014 |

* cited by examiner

SOLID-STATE IMAGING DEVICE TO IMPROVE PHOTOELECTRIC EFFICIENCY

CROSS REFERENCE TO RELATED APPLICATIONS

This application is a U.S. National Phase of International Patent Application No. PCT/JP2016/072785 filed on Aug. 3, 2016, which claims priority benefit of Japanese Patent Application No. JP 2015-182566 filed in the Japan Patent Office on Sep. 16, 2015. Each of the above-referenced applications is hereby incorporated herein by reference in its entirety.

TECHNICAL FIELD

The disclosure relates to a solid-state imaging device that is used in, for example, a CCD (Charge Coupled Device) image sensor, a CMOS (Complementary Metal Oxide Semiconductor) image sensor, and so forth, and a method of manufacturing the solid-state imaging device.

BACKGROUND ART

In recent years, in the solid-state imaging device such as the CCD image sensor and the CMOS image sensor, the device that uses an organic semiconductor in a photoelectric conversion film has been proposed (for example, PTLs 1 to 5). In the solid-state imaging device using the organic semiconductor, it is possible to achieve a device structure in which signals of a plurality of colors are acquired in one pixel without using a color filter, for example.

CITATION LIST

Patent Literature

PTL 1: Japanese Unexamined Patent Application Publication No. 2013-219190
PTL 2: Japanese Unexamined Patent Application Publication No. 2014-063999
PTL 3: Japanese Unexamined Patent Application Publication No. 2014-072328
PTL 4: Japanese Unexamined Patent Application Publication No. 2009-212468
PTL 5: Japanese Unexamined Patent Application Publication No. 2012-138582

SUMMARY OF THE INVENTION

However, there is room for improvement in the solid-state imaging device using the organic semiconductor as described above in terms of photoelectric conversion efficiency and a response speed as compared with a solid-state imaging device using an inorganic semiconductor. Achievement of a technique that makes it possible to improve the photoelectric conversion efficiency and the response speed is desired.

It is desirable to provide a solid-state imaging device and a method of manufacturing the solid-state imaging device that make it possible to improve photoelectric conversion efficiency and a response speed.

A solid-state imaging device according to an embodiment of the disclosure includes a first electrode, a second electrode, and a photoelectric conversion film that is formed between the first electrode and the second electrode and includes an organic semiconductor and an inorganic material.

A method of manufacturing a solid-state imaging device according to an embodiment of the disclosure includes forming a first electrode, forming, on the first electrode, a photoelectric conversion film that includes an organic semiconductor and an inorganic material, and forming a second electrode on the photoelectric conversion film.

In the solid-state imaging device and the method of manufacturing the solid-state imaging device according to respective embodiments of the disclosure, the photoelectric conversion film includes the organic semiconductor and the inorganic material. This makes it possible to increase exciton separation efficiency and carrier mobility more than a case where the organic semiconductor is used alone.

According to the solid-state imaging device and the method of manufacturing the solid-state imaging device according to the respective embodiments of the disclosure, the photoelectric conversion film formed between the first electrode and the second electrode includes the organic semiconductor and the inorganic material. This makes it possible to increase the exciton separation efficiency and the carrier mobility. Therefore, it is possible to improve the photoelectric conversion efficiency and response characteristics.

It is to be noted that the above described contents are merely examples of the disclosure. Effects of the disclosure are not limited to effects described above, and may be different from the effects described here or may further include any other effect.

MODES FOR CARRYING OUT THE INVENTION

In the following, embodiments of the disclosure are described in detail with reference to the drawings. It is to be noted that description is made in the following order.
1. First Embodiment (An example of a solid-state imaging device that has a photoelectric conversion film including a co-deposited film of an organic semiconductor and an inorganic material (zinc sulfide))
2. Second Embodiment (An example of a solid-state imaging device that has a photoelectric conversion film including a co-deposited film of an organic semiconductor and an inorganic material (titanium oxide))
3. Application Examples (Examples of a camera)

1. First Embodiment

[Configuration]

Figure 1:
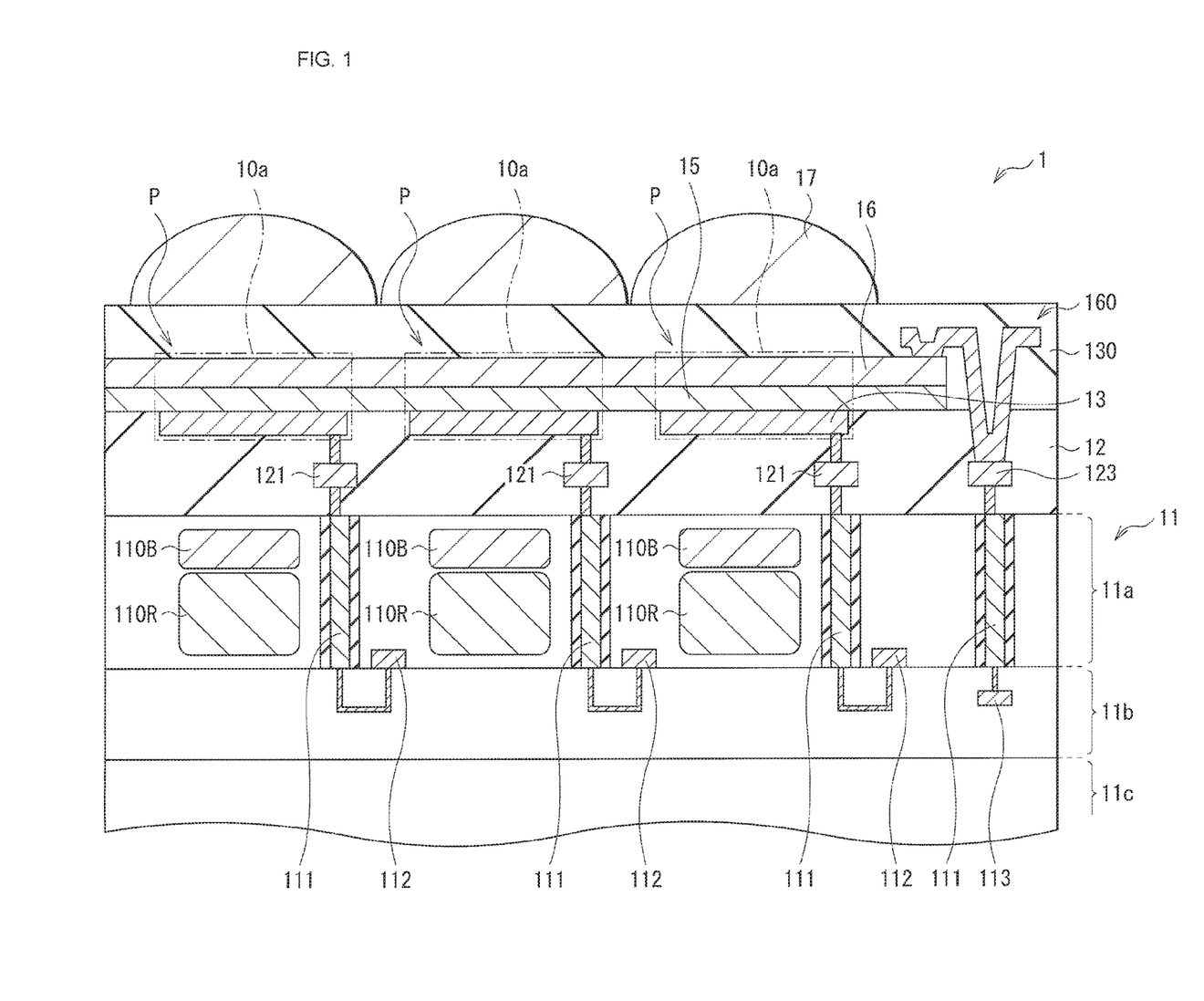
FIG. 1 is a cross-sectional view of a configuration of a solid-state imaging device according to a first embodiment of the disclosure.

FIG. 1 illustrates a cross-sectional configuration of a solid-state imaging device 1 according to a first embodiment of the disclosure. The solid-state imaging device 1 is applied to, for example, a CCD image sensor, a CMOS image sensor, and so forth. It is to be noted that FIG. 1 illustrates a region corresponding to three pixels in a pixel section (a pixel section 10 illustrated in FIG. 10) described later.

In the solid-state imaging device 1, a plurality of photoelectric conversion elements 10a are formed on a substrate 11 with an interlayer insulating film 12 being interposed therebetween. A protection film (or a planarization film) 130 is formed on the photoelectric conversion elements 10a. On-chip lenses (lenses 17) are formed on the protection film 130 for respective pixels P.

The solid-state imaging device 1 has, for example, a structure in which the photoelectric conversion elements that selectively detect and photoelectrically convert beams of light of different wavelength regions are disposed in a vertical direction. Specifically, in the solid-state imaging device 1, the photoelectric conversion element 10a (an organic photoelectric conversion element) using, for example, an organic semiconductor is formed on the substrate 11. In addition, photoelectric conversion elements 110B and 110R (photo diodes) using, for example, inorganic semiconductors are formed in the substrate 11. Owing to a laminated structure of the photoelectric conversion elements 10a, 110B, and 110R, it is possible to perform dispersion of light into respective color beams of, for example, red (R), green (G), and blue (B), without using color filters, thus making it possible to obtain a plurality of types of color signals from one pixel P.

The substrate 11 includes a semiconductor layer 11a made of, for example, silicon (Si) and so forth on side of the front-face; for example, the photoelectric conversion elements 110B and 110R are formed in the semiconductor layer 11a in an embedded state. The photoelectric conversion elements 110B and 110R each are, for example, the photo diode (Photo Diode) having a p-n junction, and are formed in order of the photoelectric conversion elements 110B and 110R in order from side of light incidence. A support substrate 11c is provided on a surface on side opposite to the photoelectric conversion elements 10a in the semiconductor layer 11a, with a wiring layer 11b being interposed therebetween. For example, as driving elements that read signals out of each of the photoelectric conversion elements 10a, 110B, and 110R, a plurality of pixel transistors are provided in the semiconductor layer 11a and the wiring layer 11b. Specific examples thereof include a transfer transistor (TRF), a reset transistor (RST), an amplification transistor (AMP), and a selection transistor (SEL).

The photoelectric conversion element 10a includes a photoelectric conversion film 15 between a first electrode 13 and a second electrode 16. The photoelectric conversion element 10a configures a main part of the solid-state imaging device 1. A specific configuration thereof is described later.

The photoelectric conversion element 110B selectively absorbs, for example, blue (for example, 450 nm to 495 nm in wavelength) light and generates electric charges. The photoelectric conversion element 110R selectively absorbs, for example, red light (for example, 620 nm to 750 nm in wavelength) and generates electric charges. The photoelectric conversion elements 110B and 110R each are coupled to the above-described transfer transistor via a non-illustrated floating diffusion (FD).

A charge storage layer 112 that stores signal charges generated by the photoelectric conversion elements 10a is formed in the substrate 11 (the semiconductor layer 11a). The charge storage layer 112 is, for example, an n-type or p-type impurity diffusion layer, and is electrically coupled to the first electrode 13. Specifically, the charge storage layer 112 and the first electrode 13 are coupled together via a through wiring line 111, a wiring line layer 121, and so forth. This allows for a configuration in which the signal charges collected in, for example, the first electrode 13 are transferred to the substrate 11.

The wiring line layers 121 and so forth are formed across one or a plurality of layers in the interlayer insulating film 12. The plurality of photoelectric conversion elements 10a are disposed on the interlayer insulating film 12. The interlayer insulating film 12 either may be a single-layer film, or may be a laminated film including two or more layers. It is to be noted that, although the details are described later, the interlayer insulating film 12 includes a portion (an insulating film 12a) that electrically separates the first electrodes 13 of the mutually adjacent photoelectric conversion elements 10a from each other.

(Photoelectric Conversion Element 10a)

Figure 2:
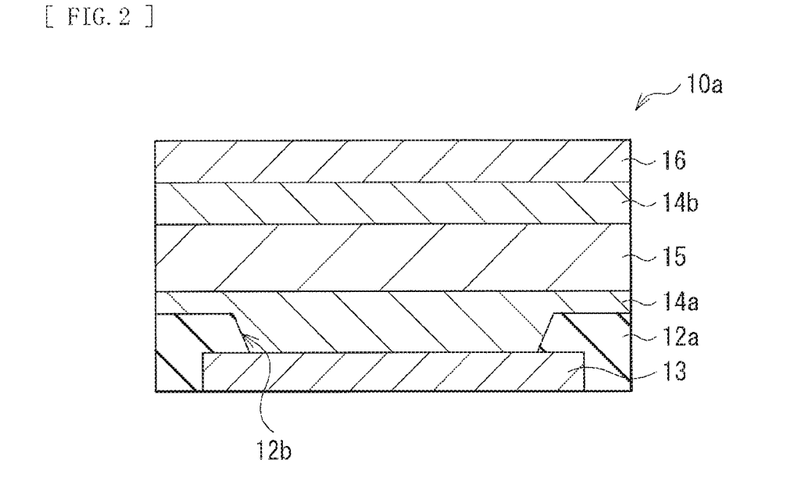
FIG. 2 is a cross-sectional view of a configuration of a photoelectric conversion element formed in each pixel illustrated in FIG. 1.

FIG. 2 illustrates a cross-sectional configuration example of the photoelectric conversion element 10a that is a main part of the solid-state imaging device 1. The photoelectric conversion element 10a is an organic photoelectric conversion element that absorbs light of a selective wavelength (for example, green light of about 495 nm to about 570 nm in wavelength) by using the organic semiconductor, for example, and that generates electron-hole pairs. The photoelectric conversion element 10a has a configuration in which the photoelectric conversion film 15 is interposed between the first electrode 13 and the second electrode 16 that act as one pair of electrodes adapted to take out the electric charges. The photoelectric conversion film 15 is provided in the form of a continuous film that is common among all the pixels P, whereas a plurality of the first electrodes 13 are disposed for respective pixels. Owing to discrete arrangement of the first electrodes 13 (separation of pixel electrodes), photoelectric conversion regions in the photoelectric conversion film 15 are electrically separated from one another on a pixel basis. A lower buffer layer 14a is formed between the first electrode 13 and the photoelectric conversion film 15, whereas an upper buffer layer 14b is formed between the photoelectric conversion film 15 and the second electrode 16.

The first electrodes 13 are provided for respective pixels, and are mutually separated electrically by the insulating film 12a between the mutually adjacent pixels. In detail, the first electrode 13 is in contact with the lower buffer layer 14a via an opening 12b provided in the insulating film 12a. The electric charges (for example, holes or electrons) are read out as the signal charges via the first electrode 13. The first electrode 13 is electrically coupled to the charge storage layer 112 formed in the substrate 11 as described above. Here, the first electrode 13 is configured by a conductive film (a transparent conductive film) having light-transmissivity. Examples of the transparent conductive film include ITO (an indium tin oxide). However, as a constituent material of the first electrode 13, a tin oxide ($SnO_2$)-based material doped with a dopant, or a zinc oxide-based material prepared by adding the dopant to a zinc oxide (ZnO) may be used other than the ITO. Examples of the zinc oxide-based materials include an aluminum zinc oxide (AZO) prepared by adding aluminum (Al) as the dopant, a gallium zinc oxide (GZO) doped with gallium (Ga), and an indium zinc oxide (IZO) doped with indium (In). In addition, CuI, $InSbO_4$, ZnMgO, $CuInO_2$, $MgIn_2O_4$, CdO, $ZnSnO_3$, and so forth may be used other than those described above.

The lower buffer layer 14a is formed with the organic semiconductor material used in, for example, the photoelectric conversion film 15 to have a predetermined thickness (for example, about 20 nm). The lower buffer layer 14a and the upper buffer layer 14b either may be formed, or may not be formed. The upper and lower buffer layers are formed as electron blocking films, hole blocking films, work function adjusting films, and so forth.

The photoelectric conversion film 15 photoelectrically converts the light of the selective wavelength (for example, green), and desirably includes one or both of the p-type and n-type organic semiconductors. Examples of the organic semiconductors include quinacridone, a quinacridone derivative, subphthalocyanine, and a subphthalocyanine derivative; it is desirable to contain one or more thereof. However, this is not limitative; as the organic semiconductors, such various materials as follows may be used. For example, one or more of naphthalene, anthracene, phenanthrene, tetracene, pyrene, perylene, fluoranthene, and so forth (all including derivatives) may be used. Alternatively, polymers or derivatives of phenylenevinylene, fluorene, carbazole, indole, pyrene, pyrrole, picoline, thiophene, acetylene, diacetylene, and so forth may be used. In addition, metal complex dyes, cyanine dyes, merocyanine dyes, phenyl xanthene dyes, triphenyl methane dyes, rhodacyanine dyes, xanthene dyes, macrocyclic azaanulene dyes, azulene dyes, naphthoquinone dyes, anthraquinone dyes, chain compounds in which a condensed polycyclic aromatic compound and a condensed aromatic ring or heterocyclic compound such as anthracene and pyrene are condensed, and two nitrogen-containing heterocyclic compounds having a squarylium group and a croconic methine group as boding chains such as quinoline, benzothiazole, and benzoxazole, or cyanine-analogous dyes that are bonded by the squarylium group and the croconic methine group, and so forth may also be used. It is to be noted that examples of the metallic complex dyes include dithiol metal complex dyes, metal phthalocyanine dyes, metal porphyrin dyes, and ruthenium complex dyes. Any other organic material such as, for example, fullerene (C60) and BCP (Bathocuproine) may be contained in the photoelectric conversion film 15 other than such organic semiconductor dyes.

The photoelectric conversion film 15 includes an inorganic material together with the organic semiconductors as described above (including a mixed film of the organic semiconductor and the inorganic material). The photoelectric conversion film 15 includes, for example, a co-deposited film of the organic semiconductor and the inorganic material (a film obtained through simultaneous film formation by a vapor deposition method in a manufacturing process described later). In the co-deposited film, it is desirable that ratios of respective volumes of the organic semiconductor and the inorganic material be different from each other. That is, it is desirable that the organic semiconductor and the inorganic material be present in a mixed state in a ratio that is shifted to either of them in the co-deposited film. Specifically, it is desirable that the volume ratio of the inorganic material be 70% or more or 30% or less. This makes it possible to suppress generation of a crack caused by mixing of the inorganic material in the co-deposited film.

The inorganic material serves to transport carriers in the photoelectric conversion film 15, and includes a material that is larger in carrier mobility than the organic semiconductor. It is desirable that the inorganic material have transparency to visible light and have, for example, a bandgap energy thereof of 3 eV or more. Specifically, it is desirable that the inorganic material have a light transmittance in the visible range of 70% or more. The organic semiconductor has a light absorption rate in the visible range of, for example, less than 30%. This makes it possible to maintain favorable spectral characteristics in the so-called vertical spectroscopic solid-state imaging device 1. In addition, it is desirable to use, as the inorganic material, a material having such a property in which thermal decomposition is less likely to occur at the time of vapor-deposited by, for example, a resistive heating system. Example of the inorganic material that meets such a condition include zinc sulfide (ZnS).

The second electrode 16 is configured by the conductive film (the transparent conductive film) having the light-transmissivity. Examples of the transparent conductive film include the ITO (indium tin oxide). However, as the constituent material of the second electrode 16, the tin oxide ($SnO_2$)-based material doped with the dopant or the zinc oxide-based material prepared by adding the dopant to the zinc oxide (ZnO) may be used other than the ITO. Examples of the zinc oxide-based materials include the aluminum zinc oxide (AZO) prepared by adding aluminum (Al) as the dopant, the gallium zinc oxide (GZO) doped with gallium (Ga), and the indium zinc oxide (IZO) doped with indium (In). In addition, CuI, $InSbO_4$, ZnMgO, $CuInO_2$, $MgIn_2O_4$, CdO, $ZnSnO_3$, and so forth may be used other than those described above. It is to be noted that, in a case where the signal charges are read out of the first electrode 13, the electric charges taken out of the second electrode 16 are discharged. Therefore, the second electrode 16 is formed in a continuous shape as an electrode that is common among the respective pixels P. However, the second electrodes 16 may be separated for respective pixels.

[Manufacturing Method]

Figure 3A:
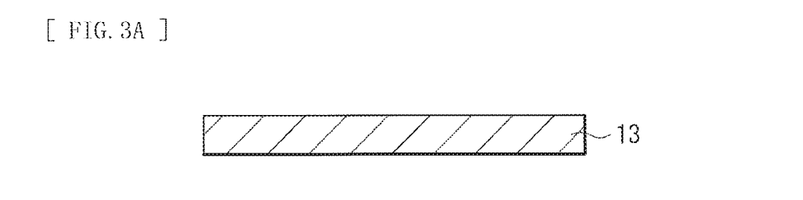
FIG. 3A is an explanatory cross-sectional view of one process of a method of manufacturing the solid-state imaging device illustrated in FIG. 1.

FIG. 3A to FIG. 6B each schematically describe a process for the main part (a manufacturing process for the photoelectric conversion element 10a) in a method of manufacturing the solid-state imaging device 1. It is possible to manufacture the photoelectric conversion element 10a, for example, in the following manner. That is, first, the first electrode 13 that includes the above-described material (for example, the ITO) is formed as a film on the substrate 11 (not illustrated in FIG. 3A), for example, by a sputtering method, as illustrated in FIG. 3A. Thereafter, the first electrode 13 formed as a film is patterned by using, for example, a photolithographic method and wet-etching.

Figure 3B:
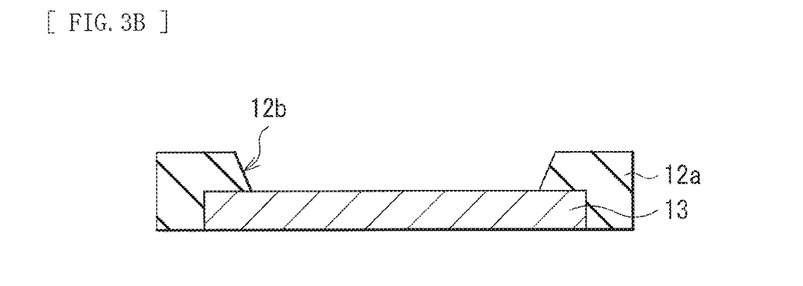
FIG. 3B is an explanatory cross-sectional view of a process following the process of FIG. 3A.

Subsequently, for example, a photoresist film is formed by coating on the first electrode 13 as the insulating film 12*a*, and the opening 12*b* is formed by the photolithographic method, as illustrated in FIG. 3B. This allows the surface of the first electrode 13 to be exposed from the insulating film 12*a*. Thereafter, the insulating film 12*a* (corresponding to a portion of the interlayer insulating film 12 in FIG. 1) by thermosetting the photoresist film.

Figure 3C:
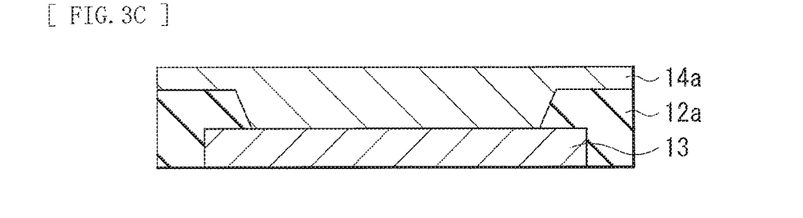
FIG. 3C is an explanatory cross-sectional view of a process following the process of FIG. 3B.

Thereafter, the lower buffer layer 14*a* is formed as a film by, for example, a vacuum vapor-deposition method to cover the portion of the first electrode 13 exposed from the opening 12*b* by using, for example, a shadow mask made of metal, as illustrated in FIG. 3C. Specifically, a material same as the material of the organic semiconductor dye contained in the photoelectric conversion film 15 (the co-deposited film) described later is formed, as the lower buffer layer 14*a*, on the first electrode 13 to have a predetermined thickness.

Figure 4:
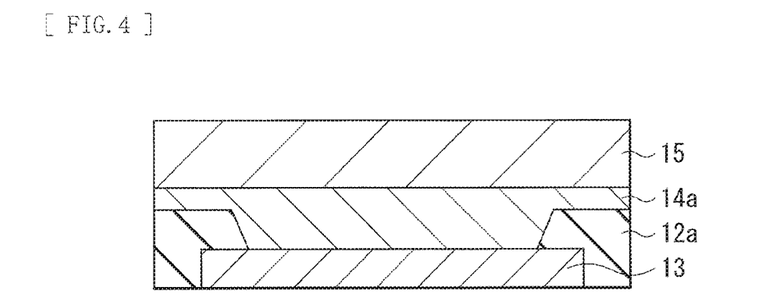
FIG. 4 is an explanatory cross-sectional view of a process following the process of FIG. 3C.
Figure 5:
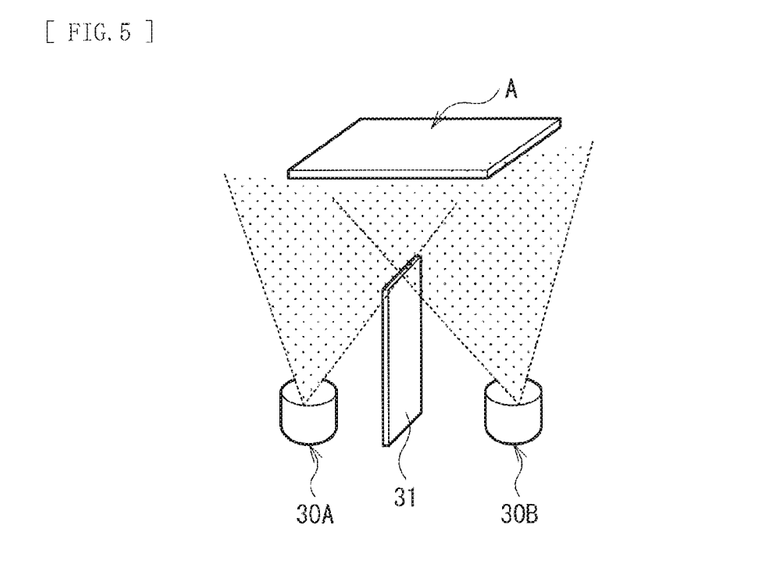
FIG. 5 schematically describes the details of the process illustrated in FIG. 4.

Thereafter, the photoelectric conversion film 15 is formed by co-deposition of the organic semiconductor and the inorganic material (for example, zinc sulfide) continuously following the formation of the lower buffer layer 14*a*, as illustrated in FIG. 4. Specifically, the organic semiconductor and the inorganic material are simultaneously vapor-deposited (co-deposited) from separate vapor deposition sources (sources) 30A and 30B by, for example, the resistive heating system respectively as schematically illustrated in FIG. 5. It is to be noted that, as a heating system for the vapor deposition sources, for example, an electron beam heating system and so forth may be used other than the resistive heating system. An appropriate system may be selected depending on a material to be used.

The vapor deposition sources 30A and 30B are disposed in a state of being partitioned by, for example, a shutter 31 in a vapor deposition device. The shutter 31 is opened near a substrate A that is a film-formation object. This allows the organic semiconductor and the inorganic material that are scattered from the respective vapor deposition sources 30A and 30B to be deposited on the substrate A while being mixed together near the substrate A. It is desirable that a film thickness monitor that monitors, for example, film-formation rates be installed on the vapor deposition sources 30A and 30B. It is possible to adjust a mixing ratio (a volume ratio) between the organic semiconductor and the inorganic material depending on a ratio between the film-formation rates thereof. As one example, in a case where the film-formation rate of zinc sulfide is 0.03 nm/s and the film-formation rate of the organic semiconductor is 0.07 nm/s, vapor deposition is completed when an integrated film thickness of the organic semiconductor reaches 70 nm. This allows for obtainment of the co-deposited film having a total thickness of 100 nm, in which the volume ratio of zinc sulfide is 30%, and the volume ratio of the organic semiconductor is 70% (having the volume ratio of zinc sulfide: the organic semiconductor=3:7).

It is possible to form the photoelectric conversion film 15 that is the co-deposited film including the organic semiconductor and the inorganic material in this way. In addition, vapor deposition by the resistive heating system is made possible by using zinc sulfide as the inorganic material. Therefore, the organic semiconductor is less likely to be damaged than a case of using the electron beam heating system. In addition, zinc sulfide is less likely to undergo thermal decomposition by resistive heating, and thus the transparency thereof is also less likely to be impaired. Accordingly, the characteristics thereof are less likely to be degraded also in the co-deposited film.

Figure 6A:
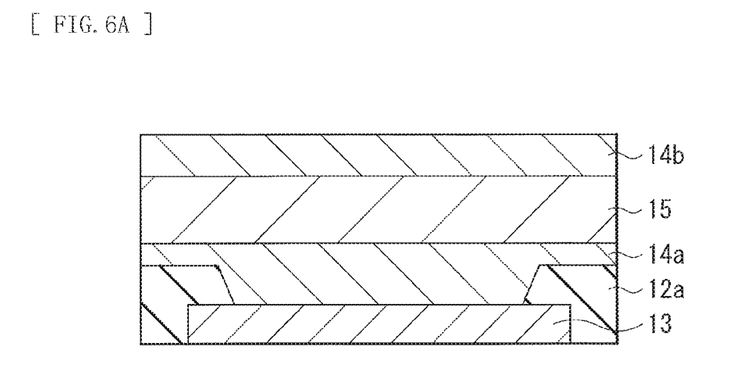
FIG. 6A is an explanatory cross-sectional view of a process following the process of FIG. 4.

Thereafter, the upper buffer layer 14*b* is formed on the photoelectric conversion film 15 as necessary as illustrated in FIG. 6A.

Figure 6B:
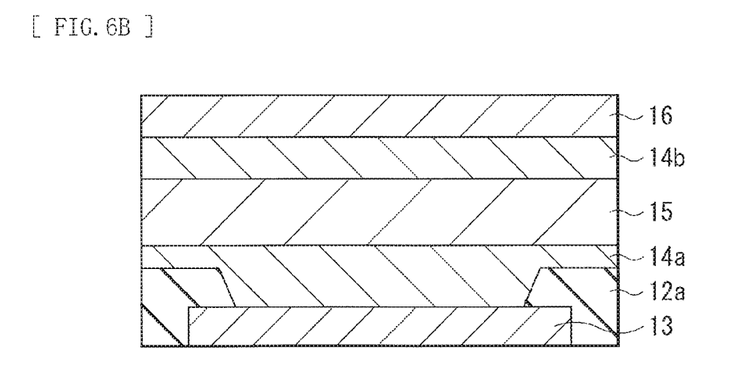
FIG. 6B is an explanatory cross-sectional view of a process following the process of FIG. 6A.

Subsequently, the second electrode 16 is formed on the upper buffer layer 14*b* by, for example, the vacuum vapor-deposition method or the sputtering method, as illustrated in FIG. 6B. It is possible to form the photoelectric conversion element 10*a* illustrated in FIG. 2 in this way.

[Effects]

In the solid-state imaging device 1 as described above, when light enters the photoelectric conversion element 10*a* via the lens 17, portion (for example, the green light) of the light that enters is absorbed by the photoelectric conversion film 15. This allows the electron-hole (hole) pairs to be generated (photoelectrically converted) in the photoelectric conversion film 15, and allows one of them to be collected, for example, on side of the first electrode 13 and to be stored in the charge storage layer 112 in the substrate 11. The electric charge stored in the charge storage layer 112 is read out as an electric signal via a pixel circuit that is not illustrated. Meanwhile, beams of light (for example, blue light and red light) that are transmitted through the photoelectric conversion film 15 are absorbed by the photoelectric conversion elements 110B and 110R in order in the substrate 11, are photoelectrically converted, and are read out as the electric signals for respective colors.

In the embodiment, the photoelectric conversion film 15 of the photoelectric conversion element 10*a* includes the organic semiconductor and the inorganic material. Accordingly, the exciton separation efficiency and the carrier mobility in the photoelectric conversion film 15 are increased as compared with a case where the organic semiconductor is used alone (a case where the inorganic material is not included). This makes it possible to improve the photoelectric conversion efficiency and the response characteristics.

In addition, the photoelectric conversion film 15 is the co-deposited film that includes the organic semiconductor and the inorganic material, thus making it possible to more easily achieve improvement in the characteristics as described above. The reason therefor is described in the following.

Here, as a comparative example of the embodiment, a case where the photoelectric conversion film is a coated film (a film formed through film formation by coating) is described. That is, in the comparative example, for example, an organic semiconductor dye and an inorganic material (for example, inorganic nanoparticles) are mixed together (inked) by using a solvent, and thereafter this solution is applied and dried to form the photoelectric conversion film. Formation of the photoelectric conversion film that includes the organic semiconductor and the inorganic material is possible also in this case. However, in this technique performed by coating, it is necessary to bond ligands to the inorganic nanoparticles in order to disperse the inorganic nanoparticles in the solution, thus making the ligands likely to remain on the surface of the film. The ligand has electric insulation and therefore prevents movement of the carriers among the inorganic nanoparticles, and causes a reduction in a response speed. In addition, it is not easy, in the coating method, to form the organic semiconductor dye and the inorganic nanoparticles as films to allow a mixed state thereof to be uniform. That is, when the mixing ratio between the organic semiconductor and the inorganic material, the solvent, a drying condition, and so forth are not properly selected, unintended phase separation occurs, causing characteristic degradation of the photoelectric conversion film.

In contrast, film formation in a vacuum is possible by forming the photoelectric conversion film 15 as the co-deposited film that includes the organic semiconductor and the inorganic material (by co-deposition of the organic semiconductor and the inorganic material) as in the embodiment. Accordingly, the ligand used in the above-described coating method is not necessary, thus making it possible to obtain a mixed film of uniform film quality. Therefore, in the photoelectric conversion film 15 that is the co-deposited film, it becomes easier to achieve improvement in the characteristics such as the photoelectric conversion efficiency and the response speed than the coated film.

In addition, in the co-deposited film, it is desirable that the ratios of the respective volumes of the inorganic material and the organic semiconductor be different from each other. Specifically, the volume ratio of the inorganic material in the co-deposited film is 70% or more or 30% or less. Here, the organic semiconductor and the inorganic material are greatly different from each other in physical properties. Accordingly, in a case where the organic semiconductor and the inorganic material are mixed together, distortion occurs in the film and a crack is likely to be generated. In a case where the organic semiconductor and the inorganic material are mixed together in an equal ratio (50% each), the crack is most likely to be generated. When the organic semiconductor and the inorganic material are mixed together in the ratio that is shifted to either the organic semiconductor or the inorganic material, the property of either of the materials thereof becomes predominant, allowing the film to have a property close to the property of a film having a single composition, thus reducing the distortion in the film. In particular, in a case where the inorganic material accounts for 70% or more or 30% or less, it is possible to sufficiently suppress the crack.

Further, it is desirable that the inorganic material included in the photoelectric conversion film 15 be transparent to the visible light. For example, the inorganic material has a light transmittance in the visible range of 70% or more. The organic semiconductor has a light absorption rate in the visible range of, for example, less than 30%. In addition, it is desirable that the inorganic material have a bandgap energy of 3 eV or more. This makes it possible to improve spectral characteristics. That is, in the vertical spectroscopic solid-state imaging device 1, the light transmitted through the photoelectric conversion element 10a (the photoelectric conversion film 15) is absorbed in the substrate 11 (the photoelectric conversion elements 110B and 110R). Accordingly, it is desirable that only the light of the selective wavelength (for example, green) be absorbed in the photoelectric conversion film 15 and that beams of light of other wavelengths be transmitted through the photoelectric conversion film 15 without being absorbed.

Here, for example, in a case where zinc oxide (ZnO) is used as the inorganic material, although vapor deposition of zinc oxide is possible by the electron beam heating system, zinc oxide has a property of being likely to be decomposed when heated. Therefore, there are cases where zinc oxide may be colored in a vapor-deposited film. In contrast, vapor deposition of zinc sulfide is possible by, for example, the resistive heating system, and zinc sulfide has a property of being less likely to undergo thermal decomposition when resistively heated. Therefore, zinc sulfide is able to maintain favorable transparency in the formed vapor-deposited film. Accordingly, in particular, in a case where zinc sulfide is used as the inorganic material, it is possible to improve the spectral characteristics as well while increasing the above-described photoelectric conversion efficiency and response speed.

As described above, in the embodiment, the photoelectric conversion film 15 formed between the first electrode 13 and the second electrode 16 includes the organic semiconductor and the inorganic material. This makes it possible to increase the exciton separation efficiency and the carrier mobility in the photoelectric conversion film 15. Therefore, it is possible to improve the photoelectric conversion efficiency and the response characteristics.

Next, an embodiment other than the above-described first embodiment is described. In the following, components similar to those of the above-described first embodiment are denoted by the same reference numerals, and description thereof is omitted where appropriate.

Second Embodiment

Figure 7:
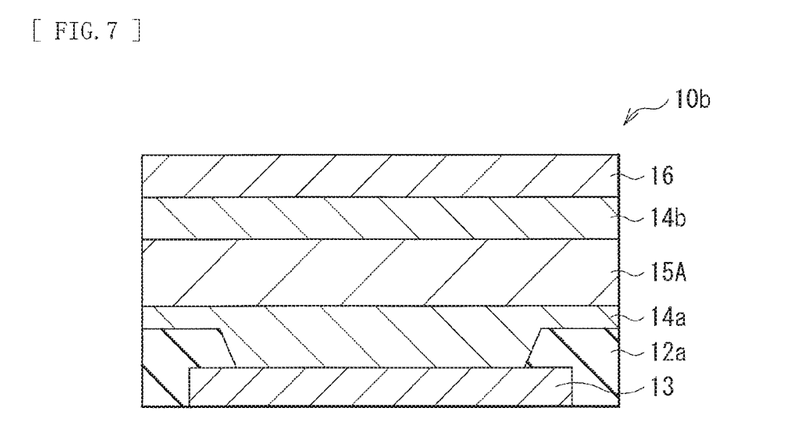
FIG. 7 is a cross-sectional view of a configuration of a main part (a configuration of a photoelectric conversion element) of a solid-state imaging device according to a second embodiment of the disclosure.

[Configuration]
FIG. 7 illustrates a cross-sectional configuration example of a photoelectric conversion element 10b that is a main part of a solid-state imaging device according to a second embodiment of the disclosure. The photoelectric conversion element 10b is also applicable to the vertical spectroscopic solid-state imaging device 1 as illustrated in, for example, FIG. 1, similarly to the photoelectric conversion element 10a according to the above-described first embodiment.

The photoelectric conversion element 10b is an organic photoelectric conversion element that absorbs light of a selective wavelength (for example, the green light of about 495 nm to about 570 nm in wavelength) by using the organic semiconductor, for example, and that generates electron-hole pairs, similarly to the photoelectric conversion element 10a according to the above-described first embodiment. The photoelectric conversion element 10b has a configuration in which a photoelectric conversion film 15A is interposed between the first electrode 13 and the second electrode 16 as one pair of electrodes adapted to take out the electric charges. The photoelectric conversion film 15A is provided as a continuous film that is common among all the pixels. The lower buffer layer 14a is formed between the first electrode 13 and the photoelectric conversion film 15A, whereas the upper buffer layer 14b is formed between the photoelectric conversion film 15A and the second electrode 16.

In addition, the photoelectric conversion film 15A photoelectrically converts the light of the selective wavelength (for example, green), similarly to the photoelectric conversion film 15 according to the above-described first embodiment, and desirably includes one or both of the p-type and n-type organic semiconductors. It is desirable to use, as the organic semiconductor, one or more of quinacridone, a quinacridone derivative, subphthalocyanine, and a subphthalocyanine derivative. However, this is not limitative; as the organic semiconductors, such various materials as follows may be used. For example, one or more of naphthalene, anthracene, phenanthrene, tetracene, pyrene, perylene, fluoranthene, and so forth (all including derivatives) may be used. Alternatively, polymers or derivatives of phenylenevinylene, fluorene, carbazole, indole, pyrene, pyrrole, picoline, thiophene, acetylene, diacetylene, and so forth may be used. In addition, metal complex dyes, cyanine dyes, merocyanine dyes, phenyl xanthene dyes, triphenyl methane dyes, rhodacyanine dyes, xanthene dyes, macrocyclic azaanulene dyes, azulene dyes, naphthoquinone dyes, anthraquinone dyes, chain compounds in which a condensed polycyclic aromatic compound and a condensed aromatic ring or heterocyclic compound such as anthracene and pyrene are condensed, and two nitrogen-containing heterocyclic compounds having a squarylium group and a croconic methine group as boding chains such as quinoline, benzothiazole, and benzoxazole, or cyanine-analogous dyes that are bonded by the squarylium group and the croconic methine group, and so forth may also be used. It is to be noted that examples of the metallic complex dyes include dithiol metal complex dyes, metal phthalocyanine dyes, metal porphyrin dyes, and ruthenium complex dyes. Any other organic material such as, for example, fullerene (C60) and BCP (Bathocuproine) may be contained in the photoelectric conversion film 15A other than such organic semiconductor dyes.

The photoelectric conversion film 15A also includes an inorganic material together with the organic semiconductors as described above (including a mixed film of the organic semiconductor and the inorganic material). The photoelectric conversion film 15A is, for example, the co-deposited film that includes the organic semiconductor and the inorganic material. The organic semiconductor and the inorganic material either may be dispersed in the film, or may have a structure (a pseudo co-deposited film described later) in which the organic semiconductor and the inorganic material are alternately and repetitively laminated. In the co-deposited film, it is desirable that ratios of respective volumes of the organic semiconductor and the inorganic material be different from each other. That is, it is desirable that the organic semiconductor and the inorganic material be present in a mixed state in a ratio that is shifted to either of them in the co-deposited film. Specifically, it is desirable that the volume ratio of the inorganic material be 70% or more or 30% or less. This makes it possible to suppress generation of a crack caused by mixing of the inorganic material in the co-deposited film.

The inorganic material serves to transport carriers in the photoelectric conversion film 15, and includes a material that is larger in carrier mobility than the organic semiconductor. It is desirable that the inorganic material have transparency to the visible light. Specifically, it is desirable that the inorganic material have a light transmittance in the visible range of 70% or more. The organic semiconductor has a light absorption rate in the visible range of, for example, less than 30%. This makes it possible to maintain favorable spectral characteristics in the so-called vertical spectroscopic solid-state imaging device 1.

In the embodiment, it is desirable to use, as such an inorganic material, a material that is higher in dielectric constant (for example, 50 or more) than the organic semiconductor and has a property of being less likely to undergo thermal decomposition when vapor-deposited by, for example, the electron beam heating system. Example of the inorganic material that meets such a condition include titanium oxide ($TiO_2$). Alternatively, $Ti_xM_{1-x}O_y$ (M is a metal element) may be used.

[Manufacturing Method]

Figure 8:
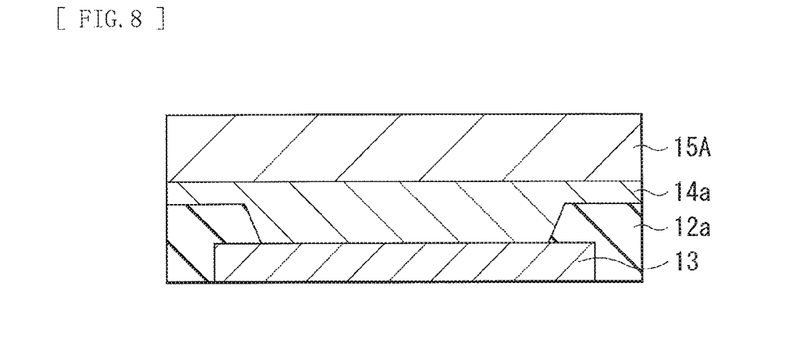
FIG. 8 is an explanatory cross-sectional view of a process of forming a photoelectric conversion film illustrated in FIG. 7.
Figure 9:
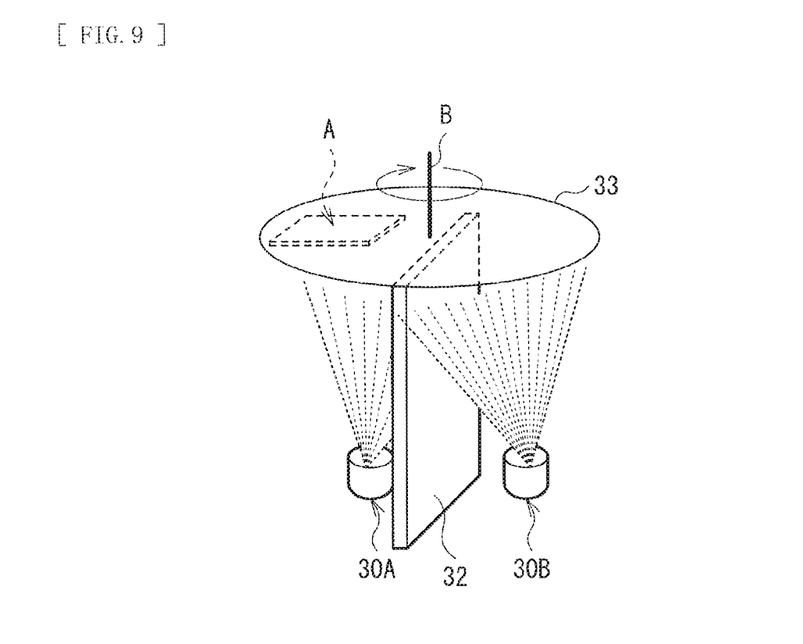
FIG. 9 schematically describes the process of forming the photoelectric conversion film illustrated in FIG. 7.

It is possible to produce the photoelectric conversion element 10b according to the embodiment, for example, in the following manner. FIG. 8 and FIG. 9 each schematically describe the manufacturing process for the photoelectric conversion element 10b. In the photoelectric conversion element 10b, for example, first, the first electrode 13, the insulating film 12a, and the lower buffer layer 14a are formed on the substrate 11, similarly to the photoelectric conversion element 10A according to the above-described first embodiment.

Thereafter, the photoelectric conversion film 15A is formed by co-deposition of the organic semiconductor and the inorganic material (for example, titanium oxide) continuously following the formation of the lower buffer layer 14a, as illustrated in FIG. 8. Specifically, the organic semiconductor and the inorganic material are simultaneously vapor-deposited (co-deposited) from the separate vapor deposition sources (sources) 30A and 30B by using, for example, the resistive heating system for the organic semiconductor and by using, for example, the electron beam heating system for the inorganic material, as schematically illustrated in FIG. 9.

In this example, the vapor deposition sources 30A and 30B are disposed in spaces that are partitioned by, for example, a partition wall 32 in the vapor deposition device. A rotary holder 33 on which the substrate A that is the film-formation object is mountable (attachable) is disposed on the partition wall 32. The rotary holder 33 is made rotatable around an axis B, with the substrate A being placed on a selective region thereof. In such a vapor deposition device, it is possible to thinly and alternately (repetitively) laminate the organic semiconductor that is scattered from the vapor deposition source 30A and the inorganic material that is scattered from the vapor deposition source 30B on the surface of the substrate A by performing vapor deposition while rotating the rotary holder 33, for example, at a high speed. As one example, a revolution speed of the rotary holder 33 may be set to 30 rpm and a film-formation rate of each material may be set to 0.1 nm/s. The characteristics of the formed photoelectric conversion film 15A is approximate to those of a uniform mixed film, thus making it possible to form a pseudo co-deposited film. Note that it is desirable that the film thickness monitor that monitors, for example, the film-formation rate be installed on the vapor deposition sources 30A and 30B similarly to the case of the above-described first embodiment. It is possible to adjust the mixing ratio (the volume rate) between the organic semiconductor and the inorganic material depending on the ratio between the film-formation rates thereof.

However, this is not limitative; the photoelectric conversion film 15A according to the embodiment may also be formed by the technique (by simultaneous vapor deposition using the vapor deposition device partitioned by the shutter 31) that is similar to that used in the photoelectric conversion film 15 according to the above-described first embodiment. In this case, in a case where the film-formation rate of titanium oxide is 0.03 nm/s and the film-formation rate of the organic semiconductor is 0.07 nm/s, vapor deposition is completed when the integrated film thickness of the organic semiconductor reaches 70 nm. This allows for obtainment of the co-deposited film having a total thickness of 100 nm, in which the volume ratio of titanium oxide is 30%, and the volume ratio of the organic semiconductor is 70% (having the volume ratio of titanium oxide:the organic semiconductor=3:7).

It is possible to form the photoelectric conversion film 15A that is the co-deposited film including the organic semiconductor and the inorganic material in this way. In addition, vapor deposition of titanium oxide is possible by the electron beam heating system, and titanium oxide is less likely to undergo thermal decomposition when heated with electron beams. Therefore, the transparency thereof is less likely to be impaired.

In addition, in a case where titanium oxide is used as the inorganic material as in the embodiment, it is desirable to use such a vapor deposition technique as illustrated, for example, in FIG. 9. Here, a melting point of titanium oxide is 1,843° C. under a normal pressure, which is an extremely high temperature as compared with a sublimation temperature of a typical organic semiconductor material. Therefore, molecules of the organic semiconductor are likely to be damaged while co-deposition is performed. Consequently, there are cases where the spectral characteristics, electric characteristics, and so forth may be lowered. In the example illustrated in FIG. 9, the vapor deposition source 30B for vapor deposition by the electron beam heating system and the vapor deposition source 30A for vapor deposition by the resistive heating system are separated from each other by the partition wall. Therefore, vapor of the organic semiconductor molecules is not exposed to secondary electrons or high-energy titanium oxide particles in a period before arriving onto the substrate A. Accordingly, the organic semiconductor molecules are less likely to be damaged, and the characteristics thereof in the co-deposited film are less likely to be degraded.

Thereafter, the upper buffer layer 14b and the second electrode 16 are formed on the photoelectric conversion film 15A, similarly to the photoelectric conversion element 10a according to the above-described first embodiment. It is possible to form the photoelectric conversion element 10b illustrated in FIG. 7 in this way.

[Effects]

When the light enters the photoelectric conversion element 10b, portion (for example, the green light) of the light that enters is absorbed by the photoelectric conversion film 15A, also in this embodiment. This allows the electron-hole (hole) pairs to be generated (photoelectrically converted) in the photoelectric conversion film 15A. In addition, the photoelectric conversion film 15A includes the organic semiconductor and the inorganic material, and thus the exciton separation efficiency and the carrier mobility in the photoelectric conversion film 15A are increased as compared with a case where the organic semiconductor is used alone (a case where the inorganic material is not included). This makes it possible to improve the photoelectric conversion efficiency and the response characteristics.

In addition, the photoelectric conversion film 15A is the co-deposited film that includes the organic semiconductor and the inorganic material, thus making it easier to achieve improvement in the characteristics such as the photoelectric conversion efficiency and the response speed than the coated film, for reasons similar to those of the above-described first embodiment.

Further, in the co-deposited film, it is desirable that the ratios of the respective volumes of the inorganic material and the organic semiconductor be different from each other. Specifically, the volume ratio of the inorganic material in the co-deposited film is 70% or more or 30% or less. Here, the organic semiconductor and the inorganic material are greatly different from each other in physical properties. Accordingly, in a case where the organic semiconductor and the inorganic material are mixed together, distortion occurs in the film and a crack is likely to be generated. In a case where the organic semiconductor and the inorganic material are mixed together in an equal ratio (50% each), the crack is most likely to be generated. When the organic semiconductor and the inorganic material are mixed together in the ratio that is shifted to either the organic semiconductor or the inorganic material, the property of either of the materials thereof becomes predominant, allowing the film to have a property close to the property of a film having a single composition, thus reducing the distortion in the film. In particular, in a case where the inorganic material accounts for 70% or more or 30% or less, it is possible to sufficiently suppress the crack.

For example, when co-deposited films (100 nm) of titanium oxide and quinacridone were formed as films on the ITO in several volume ratios and states of the formed films were observed, there existed some cracked co-deposited films. The mixing ratio (the volume ratio) of titanium oxide and a percentage (a crack generation rate) of the number of cracked elements to the number of produced elements are indicated in Table 1. As a result, in a case where the mixing ratio is 50%, the crack generation rate is the highest, whereas the crack generation rate is reduced in a composition in which the ratio is shifted to either titanium oxide or quinacridone. One reason for this is that the property of either of the materials becomes predominant and comes close to the property of the film configured by the single composition, thereby reducing the distortion in the film. From the viewpoint of structure stability of the film, it is preferable that the volume ratio of the co-deposited film be shifted to either the organic semiconductor or the inorganic material. It is desirable that the volume ratio of titanium oxide be 70% or more or 30% or less.

TABLE 1

| TiO$_2$ Mixing Ratio | Crack Generation Rate of Film |
| --- | --- |
| 100 | 0 |
| 70 | 50 |
| 50 | 80 |
| 30 | 30 |
| 0 | 0 |

In addition, when the photoelectric conversion element 10b having the co-deposited film of titanium oxide and the subphthalocyanine derivative (the volume ratio of 30% titanium oxide to 70% subphthalocyanine derivative) was produced, the photoelectric conversion efficiency became 10% under conditions of 565 nm in wavelength of irradiated light, 1.62 μW/cm$^2$ in irradiated light amount, and 1 V in applied voltage, thus allowing sufficient characteristics to be obtained.

Further, it is desirable that the inorganic material included in the photoelectric conversion film 15A be transparent to the visible light. For example, the inorganic material has a light transmittance in the visible range of 70% or more. The organic semiconductor has a light absorption rate in the visible range of, for example, less than 30%. This makes it possible to improve the spectral characteristics, similarly to the photoelectric conversion element 10a according to the above-described first embodiment.

Here, for example, in a case where zinc oxide (ZnO) is used as the inorganic material, zinc oxide has a property of being likely to be decomposed when vapor-deposited by the electron beam heating system. Therefore, there are cases where zinc oxide may be colored in the vapor-deposited film. In contrast, titanium oxide is high in dielectric constant and has a property of being less likely to undergo thermal decomposition, for example, when heated with the electron beams. Therefore, titanium oxide is able to maintain favorable transparency in the formed vapor-deposited film. Accordingly, in particular, in a case where titanium oxide is used as the inorganic material, it is possible to improve the spectral characteristics as well while increasing the photoelectric conversion efficiency and the response speed, as described above.

As described above, in the embodiment, the photoelectric conversion film 15A formed between the first electrode 13 and the second electrode 16 includes the organic semiconductor and the inorganic material. This makes it possible to increase the exciton separation efficiency and the carrier mobility in the photoelectric conversion film 15. Therefore, it is possible to obtain effects equivalent to those of the above-described first embodiment.

Application Example 1

Figure 10:
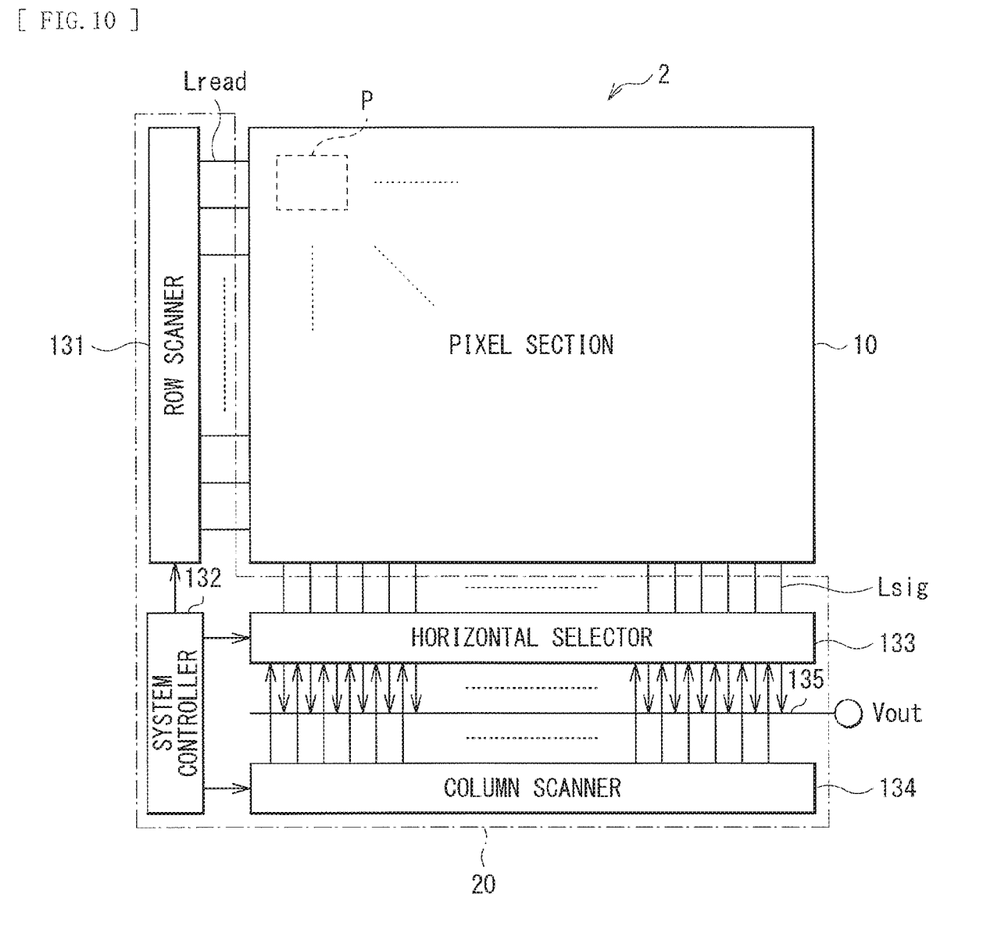
FIG. 10 is a block diagram illustrating a configuration of an imaging apparatus to which the solid-state imaging device illustrated in FIG. 1 is applied.

FIG. 10 illustrates a functional configuration of an imaging apparatus 2 in which the solid-state imaging device 1 described in the above-described first embodiment, etc. is used in the pixel section 10. The imaging apparatus 2 includes the pixel section 10 as an imaging area, and includes, in a peripheral region of the pixel section 10, a peripheral circuit section 20 that is configured by, for example, a row scanner 131, a horizontal selector 133, a column scanner 134, and a system controller 132.

The pixel section 10 includes, for example, a plurality of pixels P that are arranged in a two-dimensional array. The pixels P are wired with pixel drive lines Lread (for example, row selector lines and reset control lines) for respective pixel rows, and are wired with vertical signal lines Lsig for respective pixel columns. The pixel drive lines Lread are adapted to transmit drive signals for signal reading from the pixels P. One ends of the pixel drive lines Lread are coupled to output terminals that correspond to their respective rows of the row scanner 131.

The row scanner 131 includes, for example, a shift register and an address decoder, and serves as a pixel drive section that drives the pixels P of the pixel section 10, for example, in a row unit. Signals are outputted from the pixels P of a pixel row selected and scanned by the row scanner 131, and the signals thus outputted are supplied to the horizontal selector 133 through the respective vertical signal lines Lsig. The horizontal selector 133 includes, for example, an amplifier and horizontal selector switches that are provided for each of the vertical signal lines Lsig.

The column scanner 134 includes, for example, a shift register and an address decoder, and is adapted to scan and sequentially drive the horizontal selector switches of the horizontal selector 133. Such selective scanning by the column scanner 134 allows the signals transmitted from the pixels through the respective vertical signal lines Lsig to be sequentially outputted to a horizontal signal line 135, and to be transmitted to outside of the substrate 11 through the horizontal signal line 135 or to be inputted to an unillustrated signal processing section.

Figure 11:
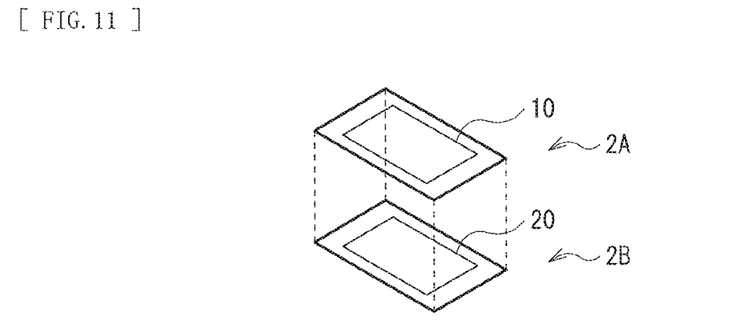
FIG. 11 schematically illustrates a configuration example of the imaging apparatus illustrated in FIG. 10.

In the imaging apparatus 2, for example, a substrate 2A (a first element substrate) including the pixel section 10 (the photoelectric conversion elements 10a and 10b) and a substrate 2B (a second element substrate) including the row scanner 131, the horizontal selector 133, the column scanner 134, the horizontal signal line 135, and so forth are laminated, as illustrated in FIG. 11. However, the above-described circuit portions is not limited to such a configuration, and may be formed on the same substrate as that of the pixel section 10, or may be disposed on an external control IC. In addition, the circuit parts may be formed on another substrate that is coupled via a cable, and so forth.

The system controller 132 is adapted to receive, for example, a clock supplied from the outside, data on instructions of operation modes, and to output data such as internal information of the solid-state imaging device 1. Furthermore, the system controller 132 includes a timing generator that generates various timing signals, and is adapted to perform drive control of peripheral circuits such as the row scanner 131, the horizontal selector 133, and the column scanner 134, based on the various timing signals generated by the timing generator.

Application Example 2

Figure 12:
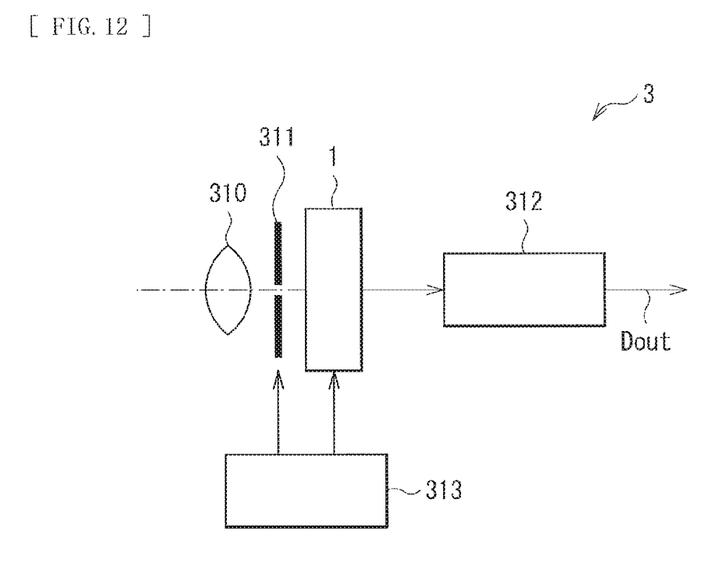
FIG. 12 is a functional block diagram illustrating one example of an application example (a camera).

The solid-state imaging device 1 according to the above-described embodiment is applied to various electronic apparatuses having imaging functions. Examples of the electronic apparatuses include camera systems such as digital still cameras and video cameras, and mobile phones having imaging functions. FIG. 12 illustrates, for purpose of an example, a schematic configuration of an electronic apparatus 2 (e.g., a camera). The electronic apparatus 3 is, for example, a camera configured to capture still images and moving pictures. The electronic apparatus 3 includes the solid-state imaging device 1, an optical system (an imaging lens) 310, a shutter device 311, a drive section 313, and a signal processing section 312. The drive section 313 is adapted to drive the solid-state imaging device 1 and the shutter device 311.

The optical system 310 is adapted to guide image light (entering light) from an object toward the solid-state imaging device 1. The optical system 310 includes a plurality of optical lenses. The shutter device 311 is adapted to control a light-irradiating period and a light-shielding period of the solid-state imaging device 1. The drive section 313 is adapted to control a transfer operation of the solid-state imaging device 1 and a shutter operation of the shutter device 311. The signal processing section 312 is adapted to perform various kinds of signal processing on signals outputted from the solid-state imaging device 1. A picture signal Dout after the signal processing is stored in a storage medium such as a memory, or is outputted to the monitor 315.

Although description has been made by giving the embodiments as mentioned above, the contents of the disclosure are not limited to the above-mentioned example embodiments and modification examples and may be modified in a variety of ways. For example, a layer configuration of the photoelectric conversion element described in the above-described embodiments is merely an example, and a further another layer may be provided. In addition, the material or the thickness of each layer are also merely examples, and are not limited to those described above.

Further, the effects described in the above-described embodiments, etc. are merely examples, and effects achieved by the disclosure may be other effects or may further include other effects.

It is to be noted that the disclosure may include the following configurations.

(1)

A solid-state imaging device including:
a first electrode;
a second electrode; and a photoelectric conversion film formed between the first electrode and the second electrode, the photoelectric conversion film including an organic semiconductor and an inorganic material.

(2)

The solid-state imaging device according to (1), in which the inorganic material has a light transmittance in a visible range of 70% or more, and the organic semiconductor has a light absorption rate in the visible range of less than 30%.

(3)

The solid-state imaging device according to (1) or (2), in which the photoelectric conversion film is a co-deposited film that includes the organic semiconductor and the inorganic material.

(4)

The solid-state imaging device according to (3), in which ratios of respective volumes of the inorganic material and the organic semiconductor in the co-deposited film are different from each other.

(5)

The solid-state imaging device according to (4), in which the ratio of the inorganic material in the co-deposited film is 70% or more or 30% or less.

(6)

The solid-state imaging device according to any one of (1) to (5), in which the inorganic material has a bandgap energy of 3 eV or more.

(7)

The solid-state imaging device according to any one of (1) to (6), in which the inorganic material includes zinc sulfide (ZnS).

(8)

The solid-state imaging device according to any one of (1) to (6), in which the inorganic material includes titanium oxide ($TiO_2$).

(9)

The solid-state imaging device according to any one of (1) to (8), in which the organic semiconductor and the inorganic material are alternately and repetitively laminated in the photoelectric conversion film.

(10)

The solid-state imaging device according to any one of (1) to (9), in which the organic semiconductor includes one or more of quinacridone, a quinacridone derivative, subphthalocyanine and a subphthalocyanine derivative.

(11)

The solid-state imaging device according to any one of (1) to (10), further including:

a first element substrate including the photoelectric conversion film; and a second element substrate including a signal processing circuit that performs a signal processing on an electric signal that is photoelectrically converted in the photoelectric conversion film, the first element substrate and the second element substrate being laminated.

(12)

The solid-state imaging device according to any one of (1) to (11), further including:

a semiconductor substrate that includes one or two or more photoelectric conversion elements, in which the first electrode, the photoelectric conversion film, and the second electrode are formed above the semiconductor substrate.

(13)

A method of manufacturing a solid-state imaging device including:

forming a first electrode;

forming, on the first electrode, a photoelectric conversion film that includes an organic semiconductor and an inorganic material; and forming a second electrode on the photoelectric conversion film.

(14)

The method of manufacturing the solid-state imaging device according to (13), in which the photoelectric conversion film is formed by co-deposition of the organic semiconductor and the inorganic material.

(15)

The method of manufacturing the solid-state imaging device according to (13) or (14), in which ratios of respective volumes of the inorganic material and the organic semiconductor in the photoelectric conversion film are different from each other.

(16)

The method of manufacturing the solid-state imaging device according to (15), in which the ratio of the inorganic material in the photoelectric conversion film is 70% or more or 30% or less.

(17)

The method of manufacturing the solid-state imaging device according to any one of (13) to (16), in which the inorganic material includes zinc sulfide (ZnS), and the forming of the photoelectric conversion film includes performing the co-deposition by using a resistive heating system for each of the organic semiconductor and the inorganic material.

(18)

The method of manufacturing the solid-state imaging device according to any one of (13) to (16), in which the inorganic material includes titanium oxide ($TiO_2$), and the forming of the photoelectric conversion film includes performing the co-deposition by using the resistive heating system for the organic semiconductor and by using an electron beam heating system for the inorganic material.

(19)

The method of manufacturing the solid-state imaging device according to any one of (13) to (18), in which the photoelectric conversion film is formed by alternately and repetitively depositing the organic semiconductor and the inorganic material.

The present application is based on and claims priority from Japanese Patent Application No. 2015-182566 filed with the Japan Patent Office on Sep. 16, 2015, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A solid-state imaging device, comprising:
    a first electrode;
    a second electrode;
    a photoelectric conversion film between the first electrode and the second electrode, wherein
        the photoelectric conversion film is a co-deposited film that includes an organic semiconductor and an inorganic material, and
        a volume ratio of the inorganic material in the co-deposited film is one of 70% or more or 30% or less; and
    an insulating layer between the first electrode and the photoelectric conversion film, wherein the insulating layer is directly stacked on a portion of the first electrode.

2. The solid-state imaging device according to claim 1, wherein
    the inorganic material has a light transmittance in a visible range,
    the light transmittance is at least 70%, the organic semiconductor has a light absorption rate in the visible range, and
the light absorption rate is less than 30%.

3. The solid-state imaging device according to claim 1, wherein the inorganic material has a bandgap energy of 3 eV or more.

4. The solid-state imaging device according to claim 1, wherein the inorganic material comprises zinc sulfide (ZnS).

5. The solid-state imaging device according to claim 1, wherein the inorganic material comprises titanium oxide (TiO2).

6. The solid-state imaging device according to claim 1, wherein the organic semiconductor and the inorganic material are alternately and repetitively laminated in the photoelectric conversion film.

7. The solid-state imaging device according to claim 1, wherein the organic semiconductor includes at least one of quinacridone, a quinacridone derivative, subphthalocyanine, or a subphthalocyanine derivative.

8. The solid-state imaging device according to claim 1, further comprising:
   a first element substrate including the photoelectric conversion film; and
   a second element substrate including a signal processing circuit configured to signal process an electric signal that is photoelectrically converted in the photoelectric conversion film,
   wherein the first element substrate and the second element substrate are laminated.

9. The solid-state imaging device according to claim 1, further comprising:
   a semiconductor substrate that includes at least one photoelectric conversion element,
   wherein the first electrode, the photoelectric conversion film, and the second electrode are on the semiconductor substrate.

* * * * *